(12) United States Patent
Chao et al.

(10) Patent No.: US 6,242,075 B1
(45) Date of Patent: Jun. 5, 2001

(54) PLANAR MULTILAYER CERAMIC STRUCTURES WITH NEAR SURFACE CHANNELS

(75) Inventors: Clinton C. Chao, Redwood City; Daniel J. Miller, San Francisco; Hubert A. VanderPlas, Palo Alto, all of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/196,939

(22) Filed: Nov. 20, 1998

(51) Int. Cl.[7] ............................... B32B 31/20; B32B 3/24
(52) U.S. Cl. ..................... 428/138; 428/131; 428/156; 428/166; 428/178; 428/188; 428/72; 174/250; 264/619; 361/754; 361/689; 156/89.12; 156/89.11; 29/851; 257/713; 257/712; 257/714
(58) Field of Search .......................... 428/131, 138, 428/156, 166, 178, 188, 72; 174/250; 361/754, 689; 156/89.12, 89.11; 264/619; 29/851; 257/713, 712, 714

(56) References Cited

U.S. PATENT DOCUMENTS

| | | | |
|---|---|---|---|
| 4,504,340 | * | 3/1985 | Tummala et al. .................. 156/89 |
| 4,833,000 | * | 5/1989 | Trickett et al. .................... 428/137 |
| 4,859,520 | | 8/1989 | Dubuisson et al. ................ 428/137 |
| 5,158,912 | * | 10/1992 | Kellerman et al. ................ 437/218 |
| 5,199,165 | | 4/1993 | Crawford et al. .................. 29/846 |
| 5,538,582 | * | 7/1996 | Natarajan et al. .................. 156/285 |
| 5,575,872 | * | 11/1996 | Tsukada et al. .................... 156/89 |
| 5,779,971 | | 7/1998 | Pan et al. ............................ 266/237 |
| 5,870,823 | * | 2/1999 | Bezama et al. ...................... 29/848 |
| 5,976,286 | * | 11/1999 | Natarajan ............................ 156/60 |

FOREIGN PATENT DOCUMENTS

WO 97/25152   7/1997 (WO) ......................... B05B/1/08

OTHER PUBLICATIONS

Vernetti et al., "Ceramic Package Design", Advanced Packaging, Jun., 1998, pp. 34–37.

* cited by examiner

Primary Examiner—William P. Watkins, III

(57) ABSTRACT

A multilayer ceramic device has top and bottom green ceramic layers machined and fired. Intermediate green ceramic layers are machined, have conductors laid down in the machined areas, are laminated, and are fired to form an enclosure layer. The areas of the layers which will be in contact with each other are coated with a bonding agent. The layers are aligned and bonded to form a structure having arbitrarily shaped, interior channels adjacent to the top and bottom layers which are not subject to detrimental nonplanarities.

20 Claims, 2 Drawing Sheets

PLANAR MULTILAYER CERAMIC STRUCTURES WITH NEAR SURFACE CHANNELS

TECHNICAL FIELD

The present invention relates generally to ceramic structures and more specifically to multilayer ceramic structures having near surface channels for electronic devices and manufacturing.

BACKGROUND ART

In the past, electro-thermal, electro-mechanical, and thermal mechanical structures have been manufactured using unfired, i.e. "green" or "raw", ceramics and glasses which are machined and then fired. These materials have been used because of their mechanical integrity and ability to be incorporated with electrical circuitry. In some cases, they were used because of high temperature resistance. Some of these devices have previously been made of multilayer ceramic construction.

The multilayer ceramic process is widely known. In general, the process consists of forming a slurry of ceramic and glass powders combined with thermoplastic organic binders and solvents. The slurry is doctor-bladed onto a carrier. After volatilization of the high vapor pressure solvents and removal from the carrier, the ceramic tape thus formed can be mechanically stamped to form clay-like, green ceramic layers. A mechanical punch or laser punching operation is used to form via holes in the green layer, and the via holes are subsequently filled with a metal paste. Metal pastes are further patterned on the surface of the green layers by a screen printing process.

A plurality of such green layers is stacked in an aligning fixture and compressed. Under these conditions the thermoplastic component of the green layers can flow and bind the layers together to form a green laminate. A high temperature firing of the green laminate results in a volatilization of the organic components, a densification of the ceramic/metal composite, and subsequent formation of the fired laminate. The densification of the green laminate is accurately controlled so that the desired fired-dimensions are achieved in the final multilayer ceramic device.

Where channels or ducts in the multilayer ceramic are desired, they can be effected by mechanically punching or laser machining openings in the green layers which will occupy internal positions in the laminate. Dubuisson, et al. (U.S. Pat. No. 4,859,520, granted Aug. 22, 1998) discloses the use of such channels for the circulation of a cooling fluid in a monolithic substrate for high power components. Crawford, et al. (U.S. Pat. No. 5,199,165, granted Apr. 6, 1993) discloses a multilayer ceramic with internal channels integral to a heat pipe. Such channels in both patents must be buried deep within the ceramic package if the flatness of the surface is to be maintained. This is due to the nature of the lamination step and the flow of the thermoplastic component of the green layers during compression.

During lamination a compressive stress of the order of 500 psi to 2,000 psi is applied to the green laminate at an elevated temperature of approximately 75° C. The thermoplastic polymer (e.g. polyvinyl butyral) within the green layers flows under these conditions and results in mutual adhesion of the green layers and conformation of the green layers around the pattern of metal paste. In addition to binding the individual green layers into a coherent green laminate, the lamination step determines the density of the green laminate and thus the shrinkage during firing and the dimensional accuracy of the fired laminate. The density of green lamination should be uniform to prevent differential shrinkage during firing.

Vertical cavities in multilayer ceramic modules can be laminated with inserts to transmit the lamination force to the bottom surface of the cavity. Such techniques cannot be used with channels since the layers of the green layers must be aligned and compressed before firing. This means the channels are totally enclosed so inserts cannot be used. It is this compression, along with gravity, which imposes internal stresses in unsupported green layers which are flexible prior to firing. This effect appears greatest where channels are near the surface of the top and bottom layers. The compression and the force of gravity on the outside green layers during lamination result in buckling, which appears as depressions and nonplanar areas, or detrimental nonplanarities, on the outside of the fired laminate above the near-surface channels. These detrimental nonplanarities become especially pronounced with the proximity of the channel to the surface; e.g., when the width of the channel exceeds the thickness of the layer above the channel.

This problem has become worse as the multilayer ceramic devices have been shrunk in size for applications requiring wider channels and thinner layers, and also where the devices are required to support integrated circuit chips which require bonding to flatter and more planar surfaces.

At the same time, new technologies have developed where it is desirable to have near surface channels in multilayer ceramic devices which require high heat resistance for carrying molten solder and thin layers to provide for increased magnetic effect, as disclosed in Tsung Pan, et al. (U.S. Pat. No. 5,779,971, granted Jul. 14, 1998).

In these situations, the sizes of the channels continue to shrink which means that deformations in the top and bottom layers may reduce the flow of fluid in the channels to the extent that the performance of the attached devices are adversely affected and the devices may become inoperable.

A solution to these problems has long been sought but has eluded those skilled in the art for a considerable length of time. Similarly, it has long been known that the problem would become even more severe with advances in technology, and thus a solution has been long sought.

DISCLOSURE OF THE INVENTION

The present invention provides a multilayer ceramic device, and manufacturing method therefor, having top and bottom green ceramic layers machined and fired. Intermediate green ceramic layers are machined, are laminated, and are fired to form an enclosure layer. The areas of the layers, which will be in contact with each other, are coated with a bonding agent. The layers are aligned and bonded to form a structure having arbitrarily shaped, interior channels adjacent to the top and bottom layers which are not subject to detrimental nonplanarities.

The present invention further provides a method for using alternative materials such as glass, silicon, and silica for the top, bottom, and intermediate layers. For the purpose of this invention, references to top, bottom, and intermediate ceramic layers include these alternative materials.

The present invention further provides a multilayer ceramic device containing internal, near surface channels in which pre-fired top and bottom layers remain planar after final assembly. The intermediate layers of the multilayer ceramic device may be fabricated using conventional multilayer ceramic technology or conventional hybrid/thick film technology as well as other technologies that will be obvious to those skilled in the art.

The present invention still further provides a multilayer ceramic device having channels not subject to size reduction due to deformation of ceramic top and bottom layers.

The present invention still further provides an ejector for molten alloys in which the ejector is made up of a plurality of fired, ceramic layers which define a channel for carrying the alloys to be ejected through orifices in top and bottom layers. The ejector is made by forming green ceramic layers and depositing an electrically conductive layer, laminating, and firing the layers to form an intermediate subassembly before bonding pre-fired top and bottom layers to the subassembly.

The present invention still further provides an ejector for electrically conductive fluids in which the ejector is made up of a plurality of fired, ceramic layers which define a channel for carrying the fluid to be ejected through orifices in top and bottom layers.

The present invention still further provides a heat ejector, or extractor, for circulating cooling fluids in which the extractor is made up of a plurality of fired, ceramic layers which define a channel for carrying the heat extraction fluids through orifices in top and bottom layers.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
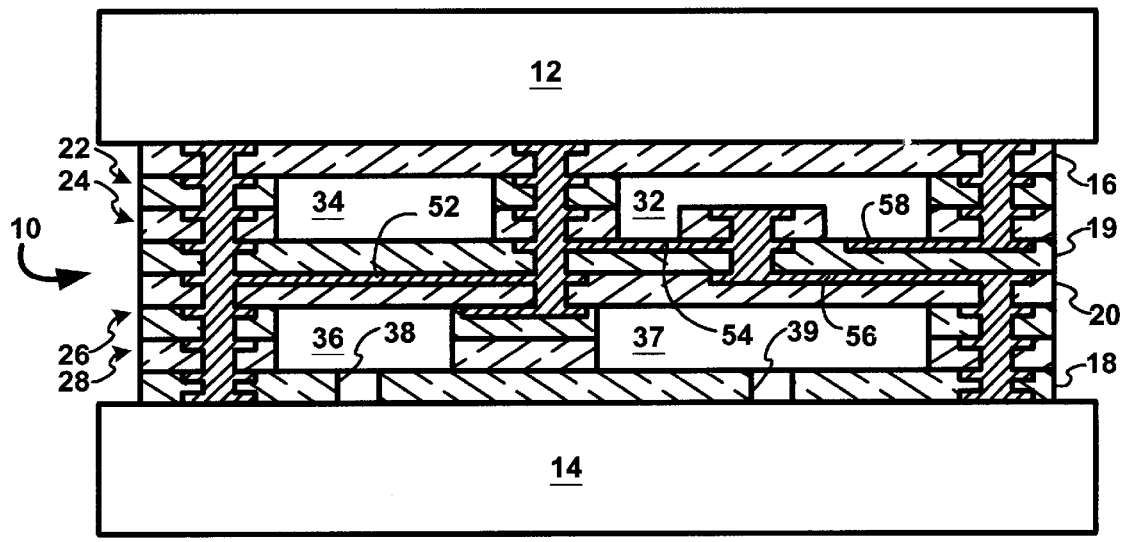
FIG. 1 (PRIOR ART) is a cross-section of a multilayer ceramic device in a compressing fixture.

Referring now to FIG. 1 (PRIOR ART), therein is shown a multilayer ceramic structure or device 10 in an assembled condition in the top and bottom fixtures 12 and 14 of a hydraulic press.

The multilayer ceramic device 10 has wide ceramic top and bottom layers 16 and 18 and wide ceramic intermediate layers 19 and 20. It should be understood that the horizontal width of the multilayer ceramic device 10 is being shown and that the ceramic layers 16, 18, 19, and 20 may have relatively long lengths compared to the widths and thicknesses shown.

The multilayer ceramic device 10 has ceramic intermediate layers 22 and 24 which space apart the ceramic top layer 16 and the ceramic intermediate layer 19. The ceramic intermediate layers 26 and 28 space apart the ceramic intermediate layer 20 and the ceramic bottom layer 18. The ceramic intermediate layers generally have square or rectangular openings provided therein although serpentine openings are possible. In the configuration shown, the multilayer ceramic device 10 has channels 32, 34, 36, and 37 which are formed by the various ceramic layers. The width and heights of the channels are shown.

For example, although top and bottom are relative since the multilayer ceramic device 10 can be used in a number of different positions, the ceramic layer 16 defines the top of the chambers 32 and 34 while the ceramic intermediate layer 19 defines its bottom. If a single channel structure were being formed, the ceramic intermediate layer 19 could form the bottom of the structure. The intermediate layers 22 and 24 effectively define the sidewalls of the channels 32 and 34 and their height. The intermediate layer 19 and the intermediate layers 22 and 24, when assembled together as a subassembly can form what can be described as an enclosure layer. The enclosure layer and the ceramic top layer 16 define the chambers 32 and 34. It should be noted that a given ceramic intermediate layer, such as intermediate layer 22, could be formed as a single piece with an elongated, enclosed vertical opening in it which could act as a short channel or via.

The ceramic bottom layer 18 is provided with orifices 38 and 39 which connect to the channels 36 and 37, respectively. These orifices 38 and 39 are particularly important when the multilayer ceramic device 10 is a molten alloy ejector since controlled droplets of molten metal will be ejected through the orifices 38 and 39.

Figure 2:
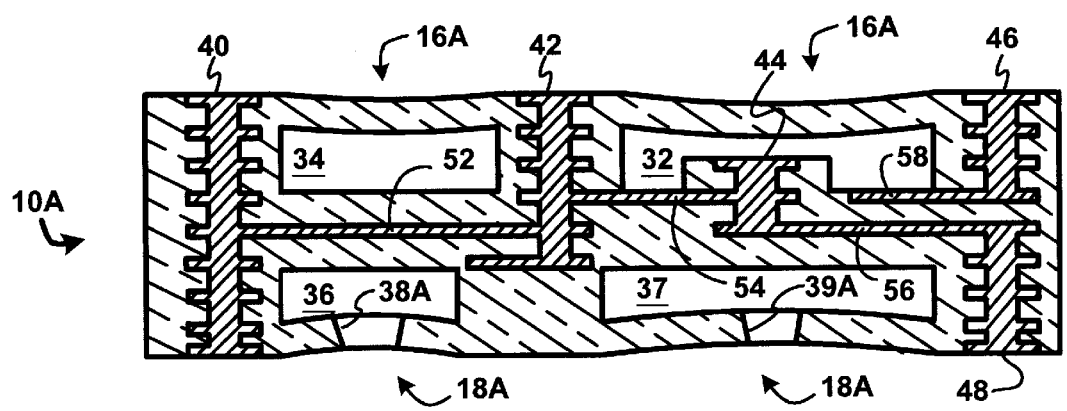
FIG. 2 is a cross-sectional view of the PRIOR ART multilayer ceramic device after cofiring.

Referring now to FIG. 2 PRIOR ART, therein is shown the prior art multilayer ceramic device 10A after being compressed between top and bottom fixtures 12 and 14, respectively, of a hydraulic press (not shown) at between 500 psi to 2,000 psi at approximately 75° C. The inward buckling of the ceramic top and bottom layers 16A and 18A which create detrimental nonplanarities in the outside surfaces is shown. Also shown are deformed orifices 38A and 39B which are a further drawback of the prior art. This problem is especially acute when the aspect ratio of the thickness of the top or bottom layer 16A or 18A to the width of the channel immediately adjacent is less than 1:1; i.e., if a top or bottom layer is thinner than the width of the channel.

Therein are further shown conductive material filled openings or vias 40, 42, 44, 46, and 48 which interconnect various levels of the multilayer ceramic device 10A. The openings for these conductive vias are generally formed by mechanical punching or laser ablation of holes into the various green, ceramic layers. The holes are subsequently filled with a metal fusible paste which will fuse with fusible paste in other via openings during the cofiring process, as will later be explained. Also, fusible metal paste in the form of conductors 52, 54, 56, and 58 are laid down by a printing process onto the green layers to be subsequently fused into a solid conductor with the conductors in the conductive vias 40, 42, 44, 46, and 48 during the laminating and cofiring process. While not conductively connected to the other conductors or vias, the conductor 58 also fuses to the via 46.

It should be understood that the various ceramic layers are processed by various machining steps for thick-film deposition of conductive materials and that the compression operation helps fuse the conductive materials and isolate those areas which are to be isolated. An example would be to isolate the via 46 and conductor 58 from the via 44 and the conductor 56.

Figure 3:
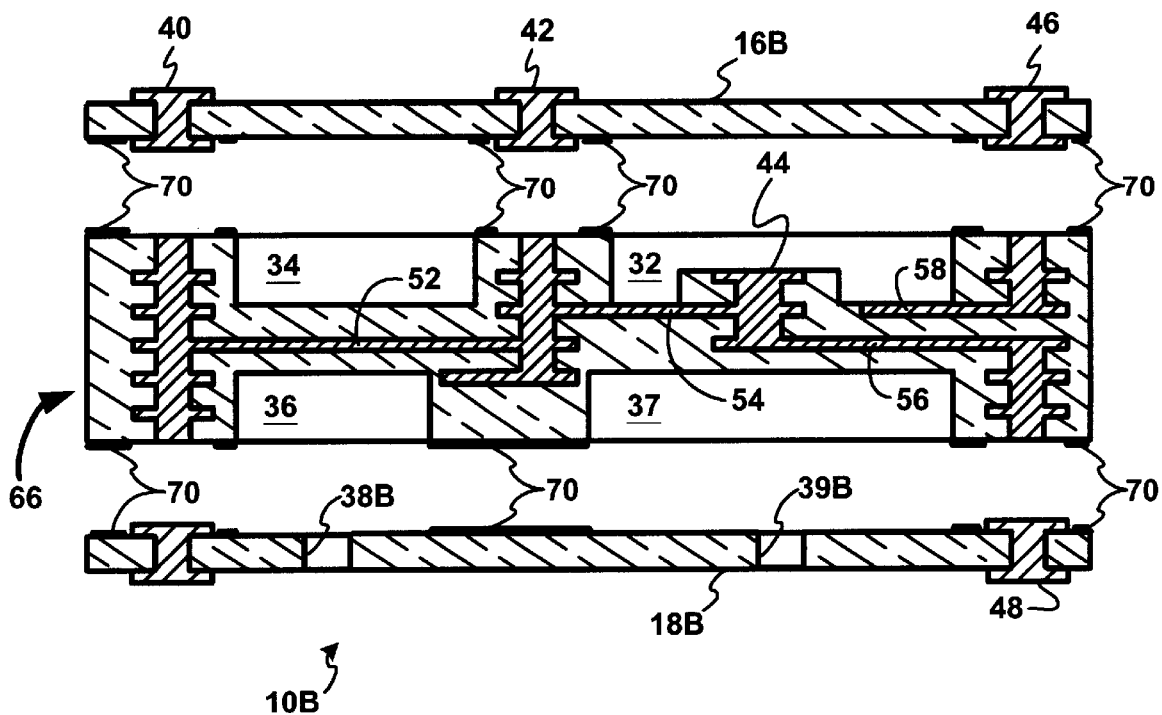
FIG. 3 is a cross-sectional view of the ceramic components prior to bonding and formation of the final multilayer ceramic device of the present invention.

Referring now to FIG. 3, therein is shown multilayer ceramic device 10B of the present invention with ceramic top layer 16B, ceramic bottom layer 18B, and a subassembly or enclosure layer 66. The ceramic top layer 16B, the ceramic bottom layer 18B, and the enclosure layer 66 have been fired as individual parts. The areas where they will contact when assembled are coated with a bonding agent 70. The bonding agent can be a ceramic sintering material, an epoxy, a brazing material, or other material for bonding surfaces together. The other parts, which are the same as those in FIG. 2, have the same part numbers.

Figure 4:
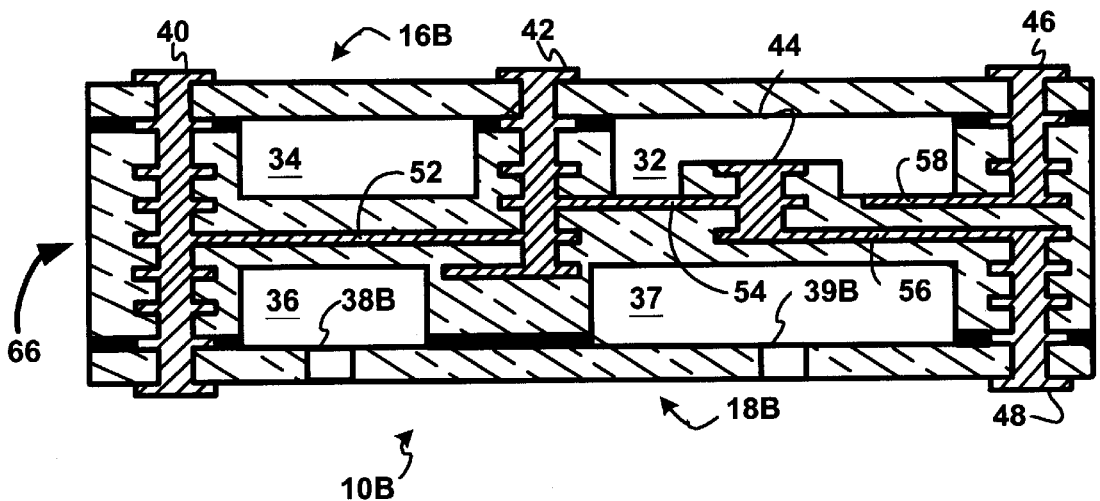
FIG. 4 is a cross-sectional view of a multilayer ceramic device of the present invention after joining of the individual components.

Referring now to FIG. 4, therein is shown multilayer ceramic device 10B of the present invention in which the ceramic top and bottom layers 16B and 18B have been bonded to the enclosure layer 66. The vias 40, 42, 46, and 48 and the conductors 52, 54, 56, and 58 have been fired so that they are electrically and mechanically connected where desired.

In the manufacture of the prior art multilayer ceramic device 10A shown in FIG. 2 (PRIOR ART), green ceramic layers are utilized. The green ceramic generally has sufficient rigidity that it is self-supporting. Green ceramic is used at this point because it is softer than fired ceramics and thus easier to process by normal manufacturing tools. For example, vias can easily be drilled or punched, and thick-film printing techniques can be used to lay down the conductive material itself. Similarly, other processes such as laser ablation and grinding are easily performed on green ceramics.

After lay down of conductive metal in the individual vias and of the conductors in the various pathways, the various ceramic layers are then aligned and then subject to compression using fixtures 12 and 14, shown in FIG. 1 (PRIOR ART), in a hydraulic press and fired. The organic binder in the green ceramic sheets flows together under pressure during lamination. During firing the organic binder is burnt out and the ceramic layers sinter into a monolithic ceramic device. At the same time, the firing fuses the fusible metal paste to be electrically and mechanically connected where desired.

In the prior art multilayer ceramic device 10A shown in FIG. 2, the pressure from the fixtures 12 and 14 in the hydraulic press during the compressing process, as well as the force of gravity, set up internal stresses. The internal stresses in the ceramic top and bottom layers 16A and 18A show themselves by buckling the ceramic top and bottom layers 16A and 18A whenever the aspect ratio of layer thickness to channel width is less than 1:1. The layers then are not planar and have irregular depressions on the top and bottom surfaces.

This buckling in the multilayer ceramic device 10A may be to such an extent that the device is rendered unusable for mounting certain types of integrated circuits on the ceramic top layer 16 which requires flatness within 0.002 inch per inch. Further, the channels 32, 34, 36, and 37 may be of such reduced size that fluid passing through the channels may be constricted to render the ceramic device 10A unable to perform the function for which it is intended. For example, cooling fluid for cooling integrated circuits on the surfaces of the ceramic layers 16A and 18A may be reduced to the point that premature failure of the integrated circuit (not shown) could occur. Similarly, a molten alloy for a molten alloy ejector (not shown) would not provide solder to certain locations on a printed circuit board.

Similarly, if the prior art structure were used, the channels 32, 34, 36, and 37 may be of such reduced size that the friction of molten metal therein might be increased to the point where the magnetic fields of the Tsung Pan et al. patent, supra, may be insufficient to provide the necessary flow to provide the proper metered volume of molten metal.

In manufacturing the multilayer ceramic device 10B of the present invention, shown in FIG. 4, the shape of the green ceramic layers 16B, 18B, 19, and 20, as well as the intermediate layers 22, 24, 26, and 28, are stamped to shape with the via holes being punched in. The via holes would then be filled in with a metal paste and the same metal paste would be printed on the layer. The individual green layers would then be compressed individually to bring the metal paste level with the surface of the layers.

Due to the thinness of the layers, metal paste printed adjacent to vertical surfaces will adhere to such surfaces. Thus, where desired for molten alloy ejectors, it would be possible to put layers of metal on the top, sidewalls, and bottom of the channels 32, 34, 36, and 37 to reduce the effect of friction or promote the wetting of the channel surfaces.

After preparation of the green, ceramic layers, the ceramic layers 16B and 18B would be placed flat on a surface in a furnace and fired such that no internal stresses would be caused by either a laminating process or the force of gravity. This eliminates detrimental nonplanarities and would leave the fired ceramic layers 16B and 18B totally planar, or flat within 0.002 inch per inch.

In the preferred embodiment, the interior green layers and intermediate layers, such as intermediate layers 22, 24, 26, and 28 with layers 19 and 20, are built up, and using inserts, are assembled, aligned, and subjected to compression and firing to create subassemblies or the enclosure layer 66. The channels 32, 34, 36, and 37 could be compressed with inserts in place to support the ceramic intermediate layers 19 and 20 while the enclosure layer 66 is formed. It is possible to control the desired green density of the subassembly such that the single and multiple layer laminates could be combined and laminated at a lower pressure. This pressure would be sufficient to achieve adhesion of the desired layers, but not great enough to significantly change the density of those areas under load.

Afterwards, the enclosure layer 66 is bonded using bonding agent 70 to ceramic top and bottom layers 16B and 18B. This multiple lamination technique just described can be used to build up complex, multilayer ceramic devices which are made up of multiple multilayer ceramic structures. These structures could have multiple near surface channels and still have exceedingly flat outer surfaces.

For bonding, a number of different techniques may be utilized. The bonding agents 70 include brazing materials such as brass, bronze, or silver alloys in a flux, vacuum-cured adhesives, epoxies, or ceramic sintering materials. In the preferred embodiment, the contacting areas of the already-fired ceramic layers would be metallized by a cofired tungsten with plated nickel. The contacting areas of the enclosure layer would then be coated with a brazing material such as Cusil, a copper-silver alloy. This allows each layer to be individually fired and assembled, or various portions to be fired, laminated, and fired as subassemblies, and then assembled as a complete structure or device. These brazing techniques are well known to those skilled in the art.

Due to the fact that the ceramic layers 16B and 18B have previously been fired, they can be very thin, yet totally planar, when assembled into the final multilayer ceramic device 10.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A ceramic structure made of a plurality of fired green ceramic layers and having a channel provided therein, said ceramic structure formed of a top layer defining a top of said channel and an enclosure layer defining the remainder of said channel, said top layer subject to detrimental nonplanarity during and after assembly of said ceramic structure, said structure comprising:

said top layer manufactured from a green ceramic fired prior to assembly in a non-stressed flat position which eliminates detrimental nonplanarity;

said enclosure layer manufactured from a green ceramic fired prior to assembly in a non-stressed flat position; and a bonding agent disposed on contacting portions of said fired top layer and said fired enclosure layer, said bonding agent bonding said contacting portions of said fired top layer and said fired enclosure layer during said assembly whereby said top layer of said ceramic structure is planar during and after said assembly.

2. The ceramic structure as claimed in claim 1 wherein:
said channel has a width; and
said top layer has a thickness less than said width of said channel.

3. The ceramic structure as claimed in claim 2 including:
an intermediate layer defining sides of said channel and manufactured from a green ceramic; and
a bottom layer defining a bottom of said channel and manufactured from a green ceramic, said bottom layer bonded to said intermediate layer under pressure and firing to form said enclosure layer.

4. The ceramic structure as claimed in claim 3 wherein:
said top layer has an opening provided therein, said opening disposed in said green ceramic prior to firing.

5. The ceramic structure as claimed in claim 4 including:
metal material disposed in said opening in said top layer prior to firing and fired with said top layer.

6. The ceramic structure as claimed in claim 5 including:
a metal layer disposed on one of said layers prior to firing and fired with said layer.

7. The ceramic structure as claimed in claim 6 wherein:
said metal material and said metal layer are cofired therewith whereby said metal material and said metal layer fuse together.

8. A fluid ejector made of a plurality of fired green ceramic layers and having a channel provided therein, said ceramic structure formed of a top layer defining a top of said channel and an enclosure layer defining the remainder of said channel, said top layer subject to detrimental nonplanarity during and after assembly of said ceramic structure, said structure comprising:

said top layer manufactured from a green ceramic fired prior to assembly in a nonstressed flat position which eliminates detrimental nonplanarity, said top layer having an orifice provided therein and a metal layer disposed thereon prior to firing;

said enclosure layer manufactured from a green ceramic fired prior to assembly, said enclosure layer having a metal layer disposed thereon prior to firing; and a bonding agent disposed on contacting portions of said fired top layer and said fired enclosure layer, said bonding agent bonding said contacting portions of said fired top layer and said fired enclosure layer during said assembly whereby said top layer of said ceramic structure is planar during and after said assembly.

9. The fluid ejector as claimed in claim 8 including:
an intermediate layer defining sides of said channel and manufactured from a green ceramic, said intermediate layer having a metal layer disposed thereon prior to firing; and a bottom layer defining a bottom of said channel and manufactured from a green ceramic, said bottom layer having a metal layer disposed thereon prior to firing, and said bottom layer bonded to said intermediate layer under pressure and firing to form said enclosure layer whereby said chamber is lined with said metal layers after assembly.

10. The fluid ejector as claimed in claim 9 wherein:
said bottom layer has openings provide therein prior to firing and metal deposited therein prior to firing, said bottom layer having metal filled openings after firing.

11. The fluid ejector as claimed in claim 10 wherein:
said metal is conductively connected throughout.

12. A method for making multilayer ceramic structures made of a plurality of fired green ceramic layers and having a channel provided therein, said ceramic structure formed of a top layer defining a top of said channel and an enclosure layer defining the remainder of said channel, said top layer subject to detrimental nonplanarity during and after assembly of said ceramic structure, comprising the steps of:

forming said top layer of a flat, green ceramic;
forming said enclosure layer of green ceramic;
firing said top layer in a flat, unstressed position in a furnace which eliminates detrimental nonplanarity;
firing said enclosure layer in a furnace;
disposing a bonding agent on contact areas of said top layer and said enclosure layer;
aligning said contact areas of said top layer and said enclosure layer to assemble said ceramic structure; and
bonding said top layer and said enclosure layer using said bonding agent whereby said top layer of said ceramic structure is planar during and after assembly.

13. The method as claimed in claim 12 wherein the step of:

forming said top layer includes forming a green ceramic layer having a predetermined thickness; and
forming said enclosure layer includes forming a green ceramic layer having an opening provided therein having a width greater than said predetermined thickness of said top layer whereby said opening and said top layer form said channel.

14. The method as claimed in claim 13 wherein the steps of forming said enclosure layer includes the steps of:
forming an intermediate layer of green ceramic, said intermediate layer having an opening provided therein defining the sides of said channel;
forming a bottom layer of green ceramic, said bottom layer defining the bottom of said channel;
aligning said intermediate layer and said bottom layer prior to assembling said ceramic substructure;
compressing said intermediate layer and said bottom layer to assemble said ceramic substructure; and
firing said intermediate layer and said bottom layer to firm said enclosure layer whereby said step of compressing and firing said pre-fired top layer and said formed enclosure layer maintains said top layer of said ceramic structure planar during and after assembly.

15. The method as claimed in claim 14 including the steps of:
forming orifices in said top layer of green ceramic prior to firing;
forming openings in said intermediate layer of green ceramic prior to firing;
forming openings in said bottom layer of green ceramic prior to firing; and aligning said intermediate layer and said bottom layer with said openings interconnected.

16. The method as claimed in claim 15 including the steps of:

depositing a fusible metal paste in said openings prior to firing;

depositing a fusible metal paste on said intermediate layer and said bottom layer prior to firing; and cofiring said fusible metal paste into selectively interconnected metal while firing said intermediate layer and said bottom layer.

17. The method as claimed in claim 16 including the step of:

forming intermediate layers of a flat, green ceramic;

forming a plurality of holes in said intermediate layers of flat, green ceramic;

depositing a fusible metal past in said holes and on said intermediate layers of flat green ceramic;

depositing said bonding agent onto contact areas of said intermediate layers with said sidewall layer and said bottom layer;

aligning said top, intermediate, and bottom layers; and cofiring said intermediate layers to bond said top, intermediate, and bottom layers, said cofiring causing said fusible metal paste to be fused into selectively interconnected metal.

18. The method as claimed in claim 17 including the steps of:

aligning said intermediate and bottom layers;

compressing said intermediate and bottom layers to assemble a ceramic subassembly;

cofiring said intermediate layers to bond to said intermediate and bottom layers forming said ceramic subassembly;

aligning said top layer with said ceramic subassembly; and firing said top layer with said ceramic subassembly to form said ceramic structure.

19. The method as claimed in claim 18 including the step of:

selectively coating said channel with said fusible metal.

20. The method as claimed in claim 19 including the step of:

metallizing the contact areas of said layers;

depositing a bonding agent of brazing material around said metallized area; and brazing said layers together.

* * * * *